(12) United States Patent
Christoph et al.

(10) Patent No.: US 10,247,523 B2
(45) Date of Patent: Apr. 2, 2019

(54) COMPOSITE LAMINATES INCORPORATING VERTICALLY ALIGNED CARBON NANOTUBES FOR BALLISTIC AND LOW VELOCITY IMPACT PROTECTION

(71) Applicant: Fortified Composites, LLC, Flower Mound, TX (US)

(72) Inventors: John Edmund Christoph, Flower Mound, TX (US); David Abram Jack, Waco, TX (US); Jordan Robert Raney, Watertown, MA (US)

(73) Assignee: Fortified Composites LLC, Flower Mound, TX (US)

( * ) Notice: Subject to any disclaimer, the term of this patent is extended or adjusted under 35 U.S.C. 154(b) by 0 days.

(21) Appl. No.: 15/346,908

(22) Filed: Nov. 9, 2016

(65) Prior Publication Data

US 2017/0167827 A1    Jun. 15, 2017

Related U.S. Application Data

(60) Provisional application No. 62/266,413, filed on Dec. 11, 2015.

(51) Int. Cl.
| | |
|---|---|
| *B32B 7/00* | (2019.01) |
| *F41H 5/04* | (2006.01) |
| *B32B 3/26* | (2006.01) |
| *B32B 9/00* | (2006.01) |
| *B32B 9/04* | (2006.01) |

(52) U.S. Cl.
CPC ............. *F41H 5/0471* (2013.01); *B32B 3/26* (2013.01); *B32B 9/007* (2013.01); *B32B 9/047* (2013.01); *B32B 2262/0269* (2013.01); *B32B 2262/101* (2013.01); *B32B 2307/558* (2013.01); *B32B 2571/02* (2013.01)

(58) Field of Classification Search
CPC ..................................... F41H 5/0417
See application file for complete search history.

(56) References Cited

U.S. PATENT DOCUMENTS

| | | | |
|---|---|---|---|
| 4,466,135 A * | 8/1984 | Coppage, Jr. | ............. F41H 1/02 2/103 |
| 6,843,953 B2 | 1/2005 | Filsinger et al. | |
| 7,537,825 B1 | 5/2009 | Wardle et al. | |

(Continued)

OTHER PUBLICATIONS

Fan et al., "Self-Oriented Regular Arrays of Carbon Nanotubes and Their Field Emission Properties", Jan. 22, 1999, Science, vol. 283, pp. 512-514, accessed through www.researchgate.net.*

(Continued)

*Primary Examiner* — Prashant J Khatri
*Assistant Examiner* — Zachary M Davis
(74) *Attorney, Agent, or Firm* — Kirby Drake

(57) ABSTRACT

Laminated composite structures, or laminates, may utilize vertically aligned carbon nanotubes (VACNTs), also termed a nanotube forest, as a layer/ply within a fiber/matrix laminate used as a protection system to mitigate and eliminate penetrating and blunt force damage posterior as a result of impacts with an unknown velocity on the laminated structure. Moreover, a composite may incorporate vertically aligned carbon nanotubes (VACNTs) for ballistic and low velocity impact protection.

10 Claims, 6 Drawing Sheets

(56) References Cited

U.S. PATENT DOCUMENTS

2014/0011007 A1* 1/2014 Raney ............... B82Y 30/00
                                                    428/217
2014/0287641 A1* 9/2014 Steiner, III ............ B32B 5/26
                                                    442/223

OTHER PUBLICATIONS

Christoph et al., "Low Velocity Impact Testing of Laminated Carbon Fiber/Carbon Nanotube Composites," Proceedings of the ASME 2015 International Mechanical Engineering Congress & Exposition, Nov. 2015, 9 pages.
Garcia et al., "Fabrication and multifunctional properties of a hybrid laminate with aligned nanotubes grown In Situ," Composite Science and Technology, Issue 68, Mar. 2008, 8 pages.
Christoph, "Investigation of the Impact Resistance of Carbon Nanotube Forests within Carbon Fiber Laminated Composites through Experimental Confirmation and Finite Element Substantiation," Masters Thesis, Baylor University, Aug. 2015, 188 pages.

\* cited by examiner

COMPOSITE LAMINATES INCORPORATING VERTICALLY ALIGNED CARBON NANOTUBES FOR BALLISTIC AND LOW VELOCITY IMPACT PROTECTION

CROSS REFERENCE TO RELATED APPLICATION

This application claims the benefit under 35 U.S.C. § 119(e) of U.S. Provisional Patent Application Ser. No. 62/266,413 filed on Dec. 11, 2015, entitled "Composite Incorporating Vertically Aligned Carbon Nanotubes for Ballistic and Low Velocity Impact Protection," which is incorporated by reference in its entirety.

FIELD OF THE DISCLOSURE

The present disclosure generally relates to composite laminates, and more particularly, to composite laminates incorporating vertically aligned carbon nanotubes for ballistic and low velocity impact protection.

BACKGROUND

Current apparatuses employed for impact damage reduction and prevention are generally heavy, restrictive, and may be limited by design and material selection constraints. Damage to the entity in need of protection is also common, especially if the protective system is in direct contact with the entity. Certain ceramic and metallic compositions are restricted by their chemical composition, preventing significant reduction in weight. While some ceramic and plastic systems may provide sufficient protection, repeated impacts may render these types of systems inadequate for further immediate protection. Additionally, singular impacts on ceramic systems can result in the development of large, fractured sections perpetrated along grain boundaries, which may severely inhibit the system's protective capabilities. Carbon fiber reinforced plastics (CFRPs) have desirable strength-to-weight ratios when compared to other materials that may be traditionally used for impact protection. CFRPs commonly exhibit high transverse moduli due to fiber orientation but can lack a significant through-thickness performance to provide practical aid under an impact load.

SUMMARY

Embodiments of the present disclosure may provide a composite laminate for use as impact protection, the composite comprising at least one layer of carbon nanotube (CNT) forest; and a plurality of individual sheets of reinforcing fibers stacked one atop another with the at least one layer of CNT forest sandwiched and infused with a resin to form the composite laminate, wherein the composite laminate may be positioned between an arbitrary impacting body and a system of interest requiring collision protection to provide impact protection. The at least one layer of CNT forest may be synthesized on a substrate prior to being stacked with the plurality of individual sheets of reinforcing fibers. The substrate may be thermally oxidized silicon. The at least one layer of CNT forest may be synthesized on the substrate through chemical vapor deposition (CVD).

The predominant reinforcing fiber may be carbon fiber. The plurality of individual sheets of reinforcing fibers may include one or more of the following: fiberglass, Kevlar®, or other aramid fibers with predetermined fiber orientation. The predetermined fiber orientation may vary depending on desired material performance or reinforcement. The resin may be a polymer resin. The polymer resin may be selected from the group comprising: vinyl ester resin, polyester resin, or epoxy resin.

The composite laminate may be formed through one of the manufacturing methods selected from the group comprising: layup, vacuum assisted resin transfer molding (VARTM), or pre-impregnated layup. The composite laminate may be positioned within a receptacle between the arbitrary impacting body and the system of interest requiring collision protection. The arbitrary impacting body may have a low or ballistic velocity. The system of interest requiring collision protection may occur naturally or may be manufactured in nature.

Other embodiments of the present disclosure may provide a composite laminate for impact protection comprising: at least one vertically aligned carbon nanotube (VACNT) stacked between one or more fabric plies to form a layup, wherein the layup may be infused with a resin to produce the composite laminate, wherein the composite laminate may provide improved through-thickness impact performance by limiting transfer of energy from an arbitrary impacting body to a system of interest fortified by the composite laminate, while maintaining in-plane stiffness for impact protection across a plurality of impact velocities. The one or more fabric plies may be formed of a reinforced fabric selected from the group comprising: carbon fiber, fiberglass, Kevlar®, or other aramid fibers with predetermined fiber orientation. The layup may be infused with the resin using a vacuum-assisted resin transfer molding (VARTM) process. The resin may solidify the fabric plies of composite laminate but not penetrate the at least one VACNT. The composite laminate may be positioned between the arbitrary impacting body and the system of interest requiring collision protection to provide impact protection.

Further embodiments of the present disclosure may provide a composite laminate for impact protection comprising: one or more vertically aligned carbon nanotube (VACNT) forests stacked within a laminated carbon fiber structure to form the composite laminate, wherein the composite laminate may be positioned between an external impacting body within unknown velocity and a system of interest requiring impact protection, thereby limiting transfer of energy from the external impacting body to the system of interest. The one or more VACNT forests stacked within a laminated carbon fiber structure may be infused with a polymer resin to form the composite laminate.

Other technical features may be readily apparent to one skilled in the art from the following figures, descriptions and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Embodiments of the present disclosure may provide a lighter, more versatile impact protection solution without compromising established protection standards across an array of industries. More specifically, embodiments of the present disclosure may provide a composite laminate including vertically aligned carbon nanotubes (VACNTs). Inclusion of VACNTs may increase the timed duration of an impact event while reducing the impact force experienced by the structure, which is a response desired for impact protection at any energy level. Additionally, the increased bulk modulus as a result of the inherent vertical orientation of the VACNTs may enhance the through-thickness performance while maintaining in-plane stiffness properties for complete impact damage mitigation across a variety of impact velocities, thus energies. Such an improved composite laminate may absorb damage while weighing less than alternative established systems that have been used to protect a system of interest from a potentially damaging impact of indeterminate velocity. The through-thickness impact performance of the composite laminate may be bolstered by limiting and/or eliminating the transfer of energy from the impacting body to the system of interest directly fortified by the composite laminate.

An embodiment of the present disclosure may include one or more vertically aligned carbon nanotube (VACNT) forests within a laminated carbon fiber structure to form a composite laminate which may be positioned between an external impacting body with unknown velocity and a system of interest requiring impact protection that may or may not comprise a receptacle. This positioning may lead to an increase in the energy dissipation with attention given to the increase in the aerial density as a result of including the VACNT forests. This positioning may lead to an increase in the energy dissipation with attention given to the composite areal density as a result of including the VACNT forests. In an embodiment of the present disclosure, the areal density may be 0.08 g/cm$^2$ for the VACNT inclusion.

Figure 1:
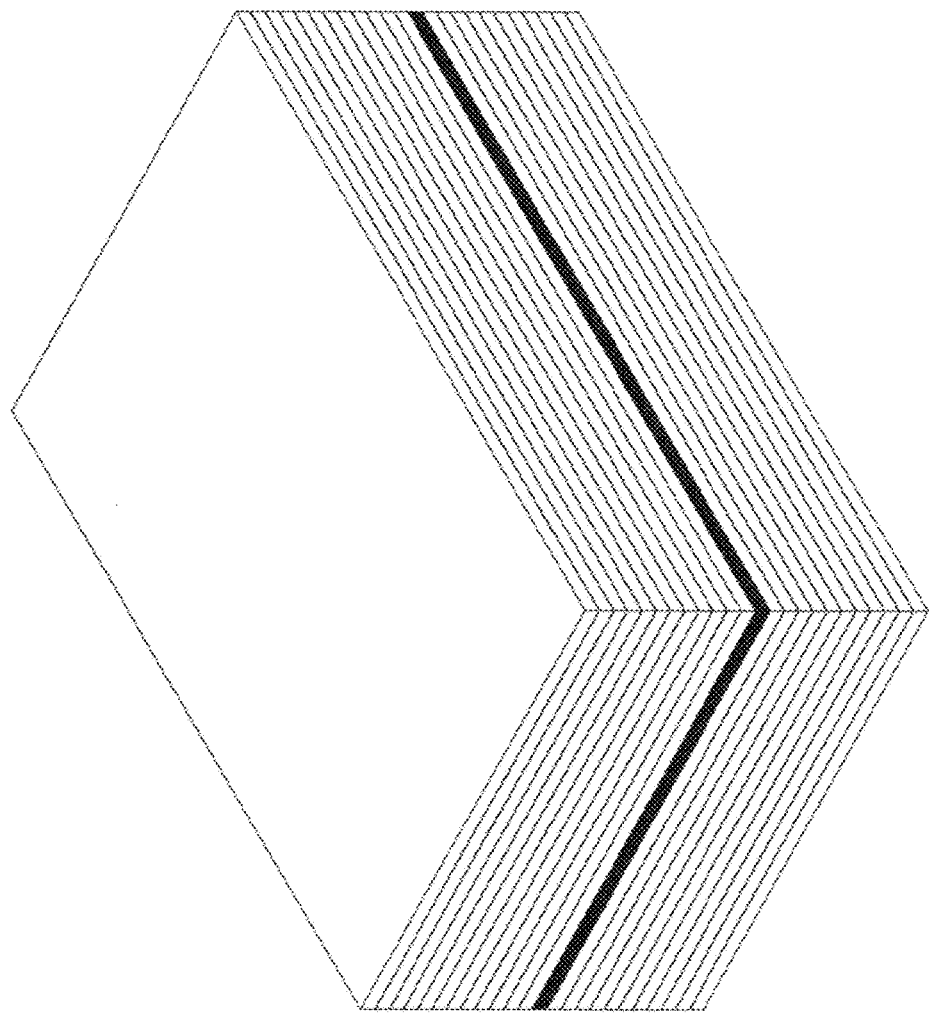
FIG. 1 illustrates a schematic isometric view of a composite laminate according to an embodiment of the present disclosure.
Figure 2:
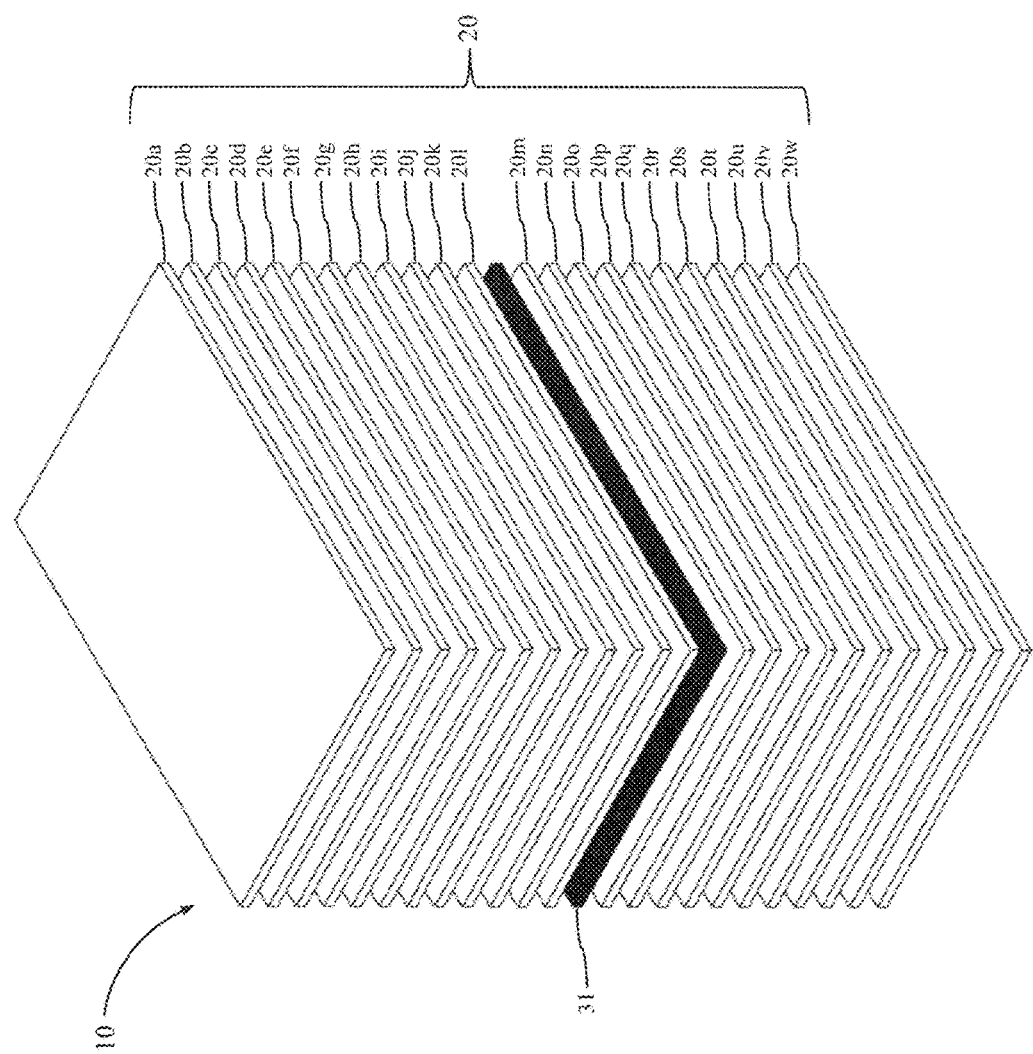
FIG. 2 illustrates an exploded, schematic view of stacked lamina used to form the composite laminate of FIG. 1 in accordance with embodiments of the present disclosure.

FIG. 1 a schematic isometric view of a composite laminate according to an embodiment of the present disclosure. FIG. 2 illustrates an exploded, schematic view of stacked lamina used to form the composite laminate of FIG. 1 in accordance with embodiments of the present disclosure. In order to form composite laminate 10, vertically aligned carbon nanotubes (VACNTs) 31 may be synthesized. This synthesis may be performed using a chemical vapor deposition (CVD) process in which a precursor solution comprising a reactive catalyst and a carbon source may be carried by a carrier gas into a reaction zone. In an embodiment of the present disclosure, synthesis may occur as depicted schematically in FIG. 6. Examples relating to this process are detailed in U.S. Pat. No. 9,045,343 and J. Christoph, *Investigation of the Impact Resistance of Carbon Nanotube Forests within Carbon Fiber Laminated Composites through Experimental Confirmation and Finite Element Substantiation*, M.S. thesis, Dept. Mech. Eng., Baylor Univ., Waco, Tex., 2015, which are herein incorporated by reference in their entirety.

Figure 6:
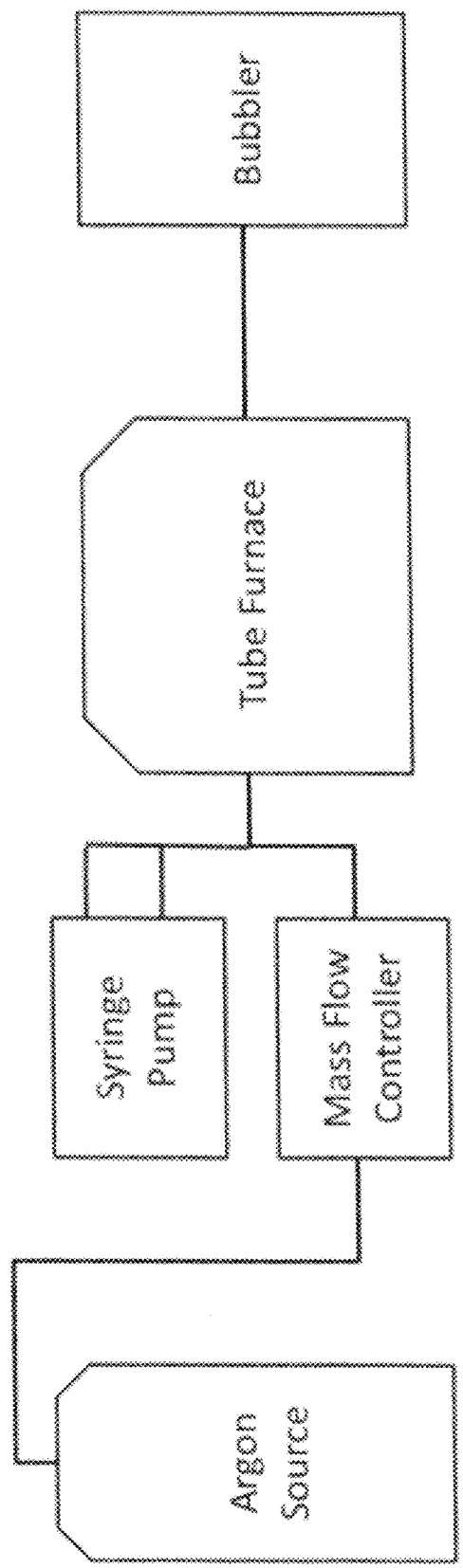
FIG. 6 depicts a chemical vapor deposition synthesis setup according to an embodiment of the present disclosure.

As depicted in FIG. 6, the CVD process may utilize a solution of ferrocene and toluene in a pure argon environment within an elevated thermal environment. The solution may be formed by dissolving approximately 2.0-2.5 g, and more specifically, approximately, 2.1-2.2 g, of ferrocene powder in approximately 100-115 mL, and more specifically, approximately, 105-110 mL, of toluene. As ferrocene has limited solubility, this may result in precipitates of ferrocene remaining following mixing. This precursor solution may pyrolyze within the furnace's single-stage heating zone to release iron atoms from ferrocene to act as the catalyst for the reaction, while toluene may provide the carbon source for the reaction to synthesize nanotubes on a thermally-oxidized silicon wafer placed in the furnace.

Pyrolysis is the thermal decomposition of organic materials in the absence of oxygen, which is paramount in the formation of CNTs using a CVD process. The floating catalyst method may deposit catalyst atoms atop the metal lattice. Shortly thereafter, toluene may break down into a variety of smaller carbon compounds, coating the nanoparticles. Growth may be initiated by the appropriate quantity and species of carbon impinging upon the catalyst particles. The variation of organic compounds within the chamber may present an added complexity in addition to the temperature gradient within the furnace that may not be accounted for during the CVD process. A vapor-phase approach such as used here may produce lower purity structures than fixed catalyst methods, but may resemble systems that may be expanded for industrial/large-scale manufacturing in embodiments of the present disclosure.

Following proficient mixing, the solution may then be transferred to two glass syringes, each of 50 milliliters; however, a single syringe may be used without departing from the present disclosure. Before the transfer between the mixing flask and the glass syringe(s), the edge of the glass plunger and the wide end of the syringe may be greased to prevent the solution from leaking back as the pump advances the plunger. Greasing also may eliminate resistance, allowing for a smooth continuous pump to maintain low flow rates. An NE-4000 Programmable 2 Channel Syringe Pump may be used to pump the syringes at a prescribed flow rate; however, another type of pump may be used without departing from the present disclosure. In some embodiments of the present disclosure, the precursor solution injection rate may be approximately 1.0 mL/min, or approximately 0.5 mL/min flow rate for each syringe. The carrier gas flow rate may be approximately 800 sccm at a temperature of approximately 1100 K, resulting in a CNT sample bulk density of approximately 0.54 g/cm$^3$ in embodiments of the present disclosure.

As previously discussed, a high-purity argon gas may be used to carry the toluene/ferrocene solution. Argon may be used as it is necessary to maintain an oxygen-free environment within the reaction chamber (i.e., minimize the presence of oxygen) as oxygen would allow a combustion reaction, which may inhibit nanotube formation (i.e., decompose the carbon structures at elevated temperatures).

Luer locks may be placed between the syringe pump and connecting tubes to prevent leakage at the syringe tip when connecting to the remainder of the flow system. Stainless steel tubing may connect the argon mass flow controller and two syringes at a cross joint that leads to the reaction space. A clear chemical-resistant tube may connect the cross joint to the quartz tube. In an embodiment of the present disclosure, the clear, chemical-resistant tube may be formed of silicon; however, other chemical-resistant materials may be used without departing from the present disclosure. The quartz tube may comprise the reaction space and be located within the furnace. The clear, chemical-resistant tube connecting the syringes to the quartz tube may provide assurance no build-up occurs in the flow system and that a smooth flow is present, rather than buildup and dumping of solution at the entrance just prior to the quartz reaction chamber. The quartz tube may be placed in a Carbolite HST 12/200 tube furnace with temperature control unit providing a space for the reaction; however, another furnace or heating mechanism may be utilized without departing from the present disclosure.

The furnace may be set to approximately 1,100 K (827° C.) during the course of the synthesis process and may be allowed sufficient time (usually approximately 20 minutes) to stabilize at the elevated temperature prior to the synthesis process. However, more or less time and/or higher or lower temperatures may be utilized without departing from the present disclosure. A single crystalline silicon substrate placed within the furnace may provide a surface for growth to initiate on in embodiments of the present disclosure. This may provide a flat surface that can be easily removed and characterized upon the completion of the synthesis. This substrate may be placed parallel to the toluene/ferrocene mixture vapor flow path, leading to vertical alignment of multi-walled carbon nanotubes according to embodiments of the present disclosure.

A diamond tipped etcher may be used to scribe the substrate into the size and shapes desired in some embodiments of the present disclosure. For all of the samples generated, the silicon substrate may be sectioned by cutting the circular substrate in half. The half circles may then be cut into three pieces, one rectangular in shape and 2-quarter circles. These three pieces may provide the substrates used in a single synthesis run. The rectangular shape may be placed into the quartz tube first closest to the flow inlet. It may then be followed by each of the quarter circles, with the point of the quarter circle facing upstream into the flow. The selection of the order and direction of the individual pieces may be altered, but this order may allow consistency of the process and repeatable depositions on the individual sections, as the deposition rate is a function of location within the CVD chamber. The second half of the silicon substrate may be used in a subsequent synthesis run. While certain shapes have been described herein, it should be appreciated that other shapes may be utilized without departing from the present disclosure.

Upon completion, the furnace may be shut off and allowed to cool over approximately a 2-hour period. During the cool down, argon may continue to flow within the chamber to prevent any buildup of oxygen within the system. This may prevent oxygen from initiating a combustion reaction that may decompose the carbon structures at the high temperatures. Once the temperature drops well below approximately 400 degrees Celsius, the argon mass flow controller may be shut off. The entire process may take approximately 4 hours, of which approximately 2 hours the furnace is in operation and heating; however, there may be embodiments of the present disclosure where more or less time may be required for cool down.

It should be appreciated that there may be embodiments of the synthesis process referenced and described herein that can have adjustments to process variables altering the resulting CNT composition, including, but not limited to, flow rate and composition of precursor solution, flow rate and composition of the carrier gas, and temperature of the furnace.

It should be appreciated that VACNTs may be synthesized on a single crystalline silicon wafer according to embodiments of the present disclosure. After separation with the wafer, the VACNTs may be placed within a carbon fiber laminated structure prior to resin infusion using vacuum assisted resin transfer molding (VARTM) as described in more detail below.

Following completion of the synthesis process, a reinforcing fabric may be selected for laminate manufacturing. The reinforcing fabric may include, but is not limited to, carbon fiber, fiberglass, and Kevlar®. The reinforcing fabric may be cut to a desired size, such as 10.2 cm×16.5 cm (4"×6.5") with the latter dimension along the length of the carbon fiber roll to establish that as the 0-degree orientation for all plies. The cuts may form fabric plies 20*a*-20*w*, as depicted in FIG. 2, which may then be stacked with carbon nanotubes 31, which may be placed between plies 20*l* and 20*m* to form the layup prior to resin injection, as depicted in FIG. 2. The selection of the size noted above may conform to ASTM D7136 so as to fit within the confines of a drop tower. However, it should be appreciated that different sizes may be utilized without departing from the present disclosure.

Figure 3:
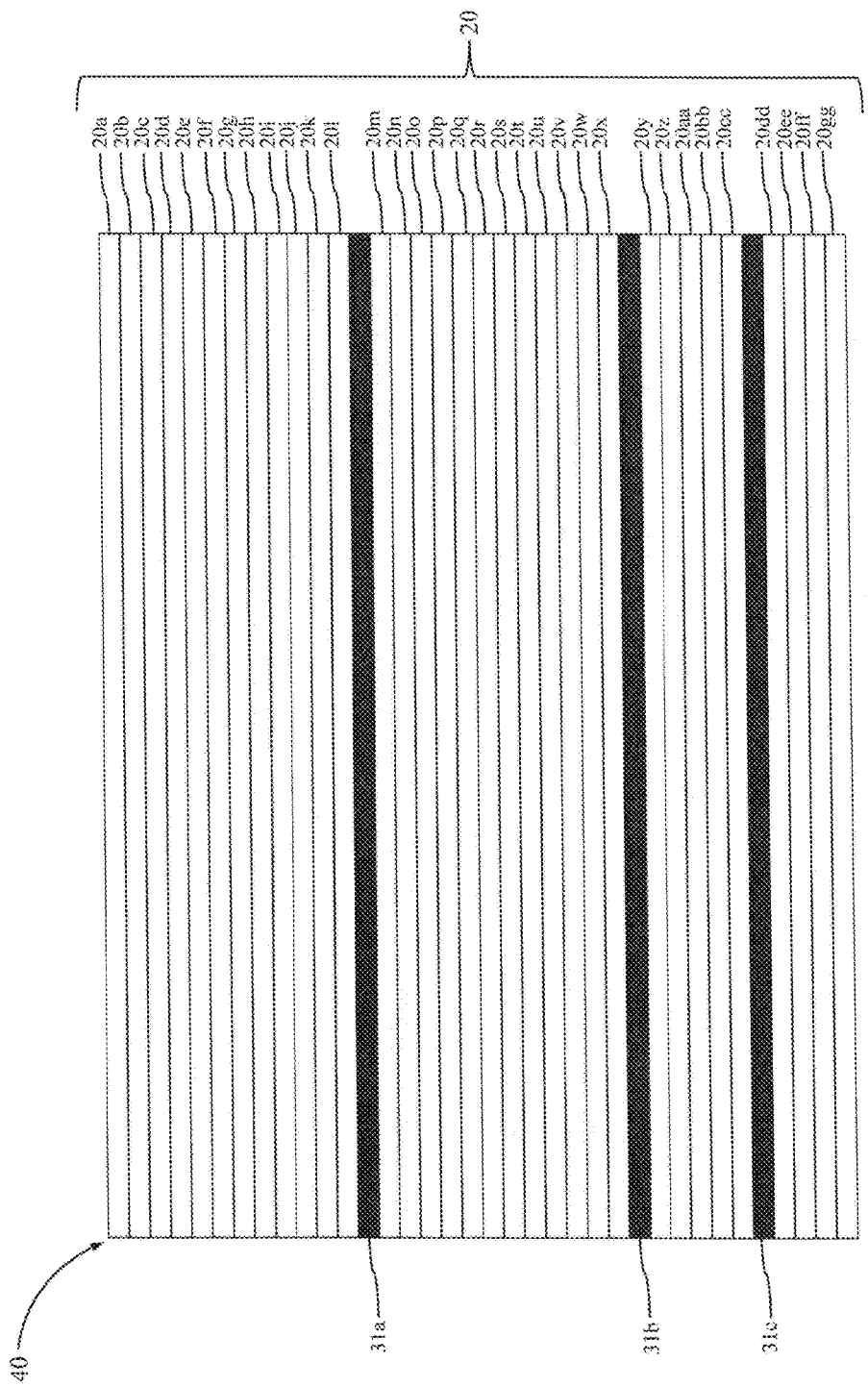
FIG. 3 illustrates a cross-sectional view of another embodiment of the present disclosure.

It should be appreciated that more or fewer plies 20 may be incorporated into composite 10 without departing from the present disclosure. Similarly, more nanotubes 31 may be incorporated into composite 10 without departing from the present disclosure. For example, composite 40 as depicted in FIG. 3 includes fabric plies 20*a*-20*gg* and a plurality of nanotubes 31*a*-31*c*. This configuration may be desirable for a higher velocity protection level; however, there may be embodiments of the present disclosure where a lower velocity protection level may be utilized, thereby requiring fewer plies 20 and/or fewer nanotubes 31.

The plies may be laid on the tooling, and the vacuum bag may then be introduced to seal the tooling. A resin may be transferred into the vacuum bagging to infuse the layup. A method may be utilized, such as described in U.S. Pat. No. 6,843,953. More specifically, a vacuum-assisted resin transfer molding (VARTM) process may be used to infuse the ply stack with resin to produce low-mass composite 10, such as depicted in FIG. 2. However, it should be appreciated that there may be some embodiments of the present disclosure where it may not be necessary to achieve such a low-mass composite. Accordingly, other embodiments of the present disclosure may use different laminate manufacturing methods, including, but not limited to, hand layup and pre-preg.

The resultant composite may be cured in different ways depending on the resin being employed. This curing step may ensure consistency in the laminate composites and eliminate variability according to embodiments of the present disclosure. It should be appreciated that different resins may be utilized according to embodiments of the present disclosure. Examples of resins may include, but are not limited to, vinyl ester resin and epoxy resin. These resins may be cured at room temperature, though this temperature may only achieve a majority of the designed possible properties such as tensile and flexural moduli. Some of these properties may be achieved through introduction of a post-cure cycle, which may differ depending on the resin selected. However, it should be appreciated that there may be embodiments where no post-cure cycle may be employed. After the cure cycle(s) has been completed, the composite laminate may be removed from the tooling for testing and eventual use.

Figure 4A:
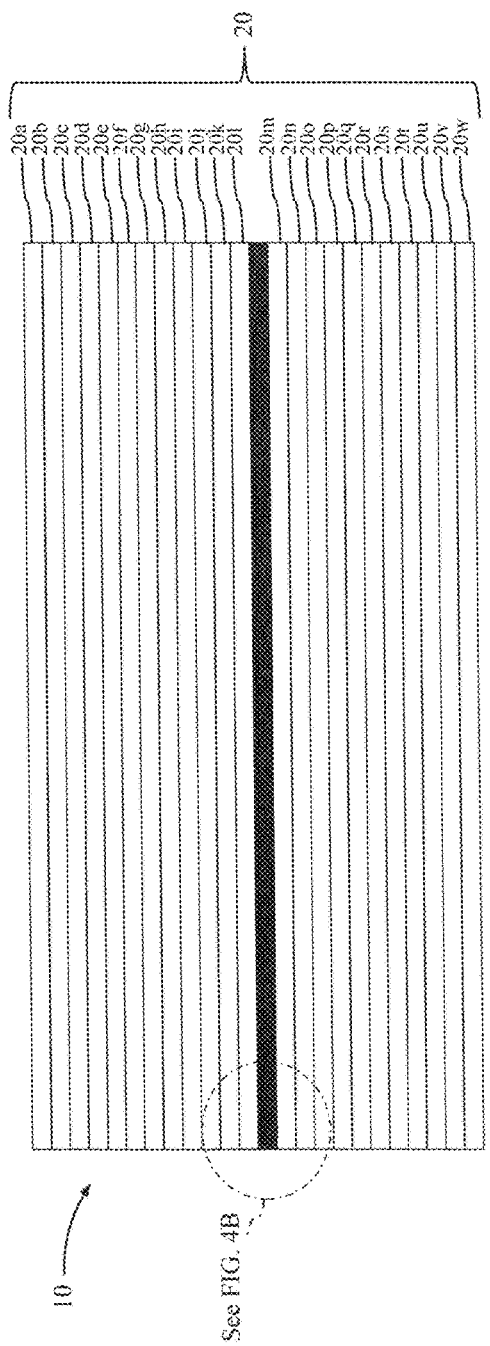
FIG. 4A illustrates a cross-sectional schematic view of the composite laminate in FIG. 1 in accordance with embodiments of the present disclosure.

FIG. 4A illustrates a cross-sectional schematic view of the composite in FIG. 1 in accordance with embodiments of the present disclosure. More specifically, FIG. 4A depicts composite laminate 10 after curing according to an embodiment of the present disclosure. From the exterior, all layers of composite laminate 10 may appear bonded inside the composite structure.

Figure 4B:
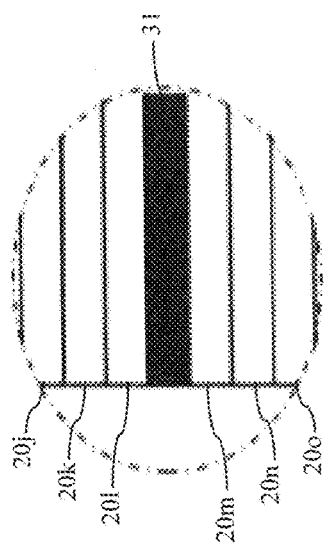
FIG. 4B illustrates an enlarged view of a portion of the composite laminate of FIG. 4A in accordance with embodiments of the present disclosure.

FIG. 4B illustrates an enlarged view of a portion of the composite of FIG. 4A in accordance with embodiments of the present disclosure. More specifically, FIG. 4B depicts an exemplary interlaminar interface in greater detail, particularly, VACNTs 31 between plies 20*l* and 20*m*. In some embodiments of the present disclosure, there may be direct increased interlaminar reinforcement via VACNTs 31 between plies 20*l* and 20*m*, similar to that disclosed in U.S. Pat. No. 7,537,825. Though the infused resin described herein may solidify the plies into composite laminate 10, resin may not penetrate the nanotube foam structure in some embodiments of the present disclosure.

Figure 5A:
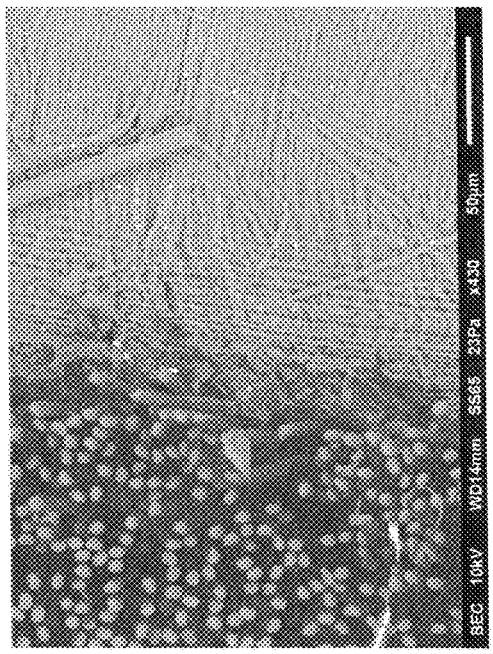
FIG. 5A illustrates a SEM image of an exemplary sample of the VACNT and carbon fiber interlaminar region post-resin infusion in accordance with embodiments of the present disclosure.

FIG. 5A illustrates a scanning electron microscope (SEM) image of an exemplary sample of the VACNT and carbon fiber interlaminar region post-resin infusion in accordance with embodiments of the present disclosure. As depicted herein, the larger carbon fibers and VACNT structure may be void of resin bonding the laminae.

Figure 5B:
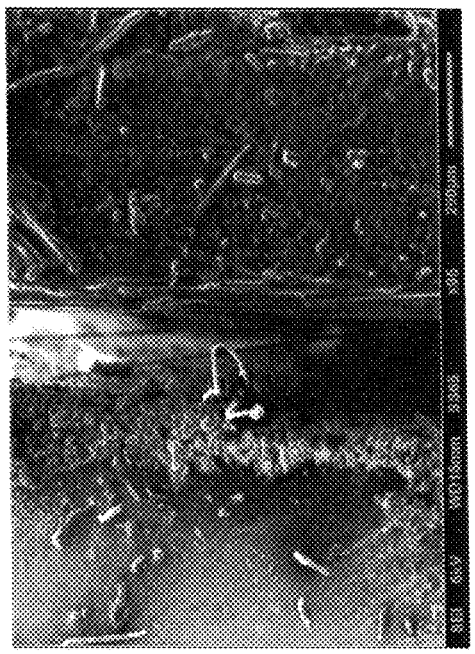
FIG. 5B illustrates a SEM image of an exemplary sample of the VACNT and carbon fiber interlaminar region separation post-resin infusion in accordance with embodiments of the present disclosure.

FIG. 5B illustrates a SEM image of an exemplary sample of the VACNT and carbon fiber interlaminar region separation post-resin infusion in accordance with embodiments of the present disclosure. More specifically, FIG. 5B illustrates some separation between carbon fiber laminae, such as 20*l* and 20*m*, and nanotube foam structure 31. Though the composite laminate as a whole may remain intact, the nanotube/fiber interfaces may not completely coalesce in some embodiments of the present disclosure. Previous studies have shown nanotubes to have inherent capillary effects (see e.g., E. J. Garcia et al., Fabrication and multifunctional properties of a hybrid laminate with aligned carbon nanotubes grown In Situ, Compos. Sci. Technol., Vol. 68, No. 9, pp. 2034-2041, July 2008).

It should be appreciated that composites 10, 40 may have adjustments to process and/or material variables including, but not limited to, adjusting the through-thickness impact performance and/or the overall weight of the composite. Further, the placement of nanotube plies 31, the total number of fabric plies 20, the number of nanotube plies 31 and/or the resin type may be altered according to embodiments of the present disclosure.

Drop tower tests similar to ASTM D7136 were performed, and as described in more detail in J. Christoph et al., Low Velocity Impact Testing of Laminated Carbon Fiber/Carbon Nanotube Composites, Proc. ASME 2015 International Mechanical Engineering Congress & Exposition; 10.1115:IMECE2015-52984, the disclosure of which is herein incorporated by reference in its entirety, the results indicate an improved damage tolerance of the laminate when an carbon nanotube (CNT) system has been included.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A collision-protected system of interest comprising a composite laminate positioned on or about the system of interest requiring collision protection to provide impact protection from an arbitrary impacting body, the composite laminate consisting of:
    at least one layer of carbon nanotube (CNT) forest that is vertically aligned in makeup having a bulk density of approximately 0.54 g/cm$^3$ with a nominal areal density of 0.08 g/cm$^2$ and
    a plurality of individual sheets of reinforcing fibers stacked one atop another with the at least one layer of CNT forest sandwiched and infused with a resin to form the composite laminate, wherein the at least one layer of CNT forest is formed as its own layer separate from the plurality of individual sheets of reinforcing fibers, and wherein the predetermined fiber orientation varies depending on desired material performance or reinforcement.

2. The collision-protected system of interest comprising the composite laminate of claim 1 wherein the at least one layer of CNT forest is synthesized on a substrate prior to being stacked with the plurality of individual sheets of reinforcing fibers.

3. The collision-protected system of interest comprising the composite laminate of claim 2 wherein the substrate is thermally oxidized silicon.

4. The collision-protected system of interest comprising the composite laminate of claim 2 wherein the at least one layer of CNT forest is synthesized on the substrate through chemical vapor deposition (CVD).

5. The collision-protected system of interest comprising the composite laminate of claim 1 wherein the predominant reinforcing fiber is carbon fiber.

6. The collision-protected system of interest comprising the composite laminate of claim 1 wherein the plurality of individual sheets of reinforcing fibers include one or more of the following:
    fiberglass, para-aramid synthetic fiber, or other aramid fibers with predetermined fiber orientation.

7. The collision-protected system of interest comprising the composite laminate of claim 1 wherein the resin is a polymer resin.

8. The collision-protected system of interest comprising the composite laminate of claim 7 where the polymer resin is selected from the group consisting of:
    vinyl ester resin, polyester resin, or epoxy resin.

9. The collision-protected system of interest comprising the composite laminate of claim 1 wherein the composite laminate is formed through one of the manufacturing methods selected from the group consisting of:
    layup, vacuum assisted resin transfer molding (VARTM), or pre-impregnated layup.

10. The collision-protected system of interest comprising the composite laminate of claim 1 wherein the system of interest receives the composite laminate in a receptacle.

\* \* \* \* \*